United States Patent
Kuo et al.

(10) Patent No.: US 9,232,679 B1
(45) Date of Patent: Jan. 5, 2016

(54) DRAWING STRUCTURE FOR USE IN STORAGE DEVICE OF SERVER

(71) Applicant: AIC INC., Taoyuan Hsien (TW)

(72) Inventors: Chung-I Kuo, Taoyuan Hsien (TW); Lin-Kuei Tsai, Taoyuan Hsien (TW); Su-Chin Chen, Taoyuan Hsien (TW)

(73) Assignee: AIC INC., Taoyuan Hsien (TW)

( * ) Notice: Subject to any disclaimer, the term of this patent is extended or adjusted under 35 U.S.C. 154(b) by 0 days.

(21) Appl. No.: 14/327,504

(22) Filed: Jul. 9, 2014

(51) Int. Cl.
*H05K 7/14* (2006.01)
*G06F 1/18* (2006.01)
*H05K 5/00* (2006.01)
*H05K 5/02* (2006.01)

(52) U.S. Cl.
CPC .............. *H05K 7/1489* (2013.01); *G06F 1/187* (2013.01); *H05K 5/0069* (2013.01); *H05K 5/0256* (2013.01)

(58) Field of Classification Search
CPC ....... G06F 1/187; G06F 1/183; H05K 7/1487; H05K 7/1489; H05K 7/14; H05K 5/0026; H05K 5/0065; H05K 5/0069; H05K 5/0073; H05K 5/0217; H05K 5/0247; H05K 5/0256; H05K 5/04; G11B 33/00; G11B 33/125; G11B 33/126; G11B 33/127; G11B 33/128
See application file for complete search history.

(56) References Cited

U.S. PATENT DOCUMENTS

| | | | |
|---|---|---|---|
| 6,232,550 B1* | 5/2001 | Mangold | 174/545 |
| 6,618,256 B1* | 9/2003 | Bovio et al. | 361/727 |
| 6,762,932 B2* | 7/2004 | Regimbal et al. | 361/679.33 |
| 6,930,247 B2* | 8/2005 | Chen et al. | 174/50 |
| 6,999,308 B2* | 2/2006 | Hsu | 361/679.33 |
| 7,054,151 B2* | 5/2006 | Wang et al. | 361/679.31 |
| 7,088,579 B1* | 8/2006 | Konshak | 361/679.32 |
| 7,589,961 B2* | 9/2009 | Jiang et al. | 361/679.38 |
| 8,189,327 B2* | 5/2012 | Chang | 361/679.31 |
| 2007/0076379 A1* | 4/2007 | Hong et al. | 361/728 |
| 2010/0254080 A1* | 10/2010 | Tamaki | 361/679.33 |
| 2011/0222235 A1* | 9/2011 | Easton | 361/679.33 |
| 2012/0145862 A1* | 6/2012 | Peng et al. | 248/298.1 |
| 2012/0155008 A1* | 6/2012 | Chen | 361/679.33 |
| 2012/0223201 A1* | 9/2012 | Chen et al. | 248/309.1 |
| 2013/0313955 A1* | 11/2013 | Kuo | 312/326 |
| 2013/0335912 A1* | 12/2013 | Han et al. | 361/679.33 |

FOREIGN PATENT DOCUMENTS

TW         M 440509 U  * 11/2012 ........... G11B 33/124

* cited by examiner

*Primary Examiner* — Andrew Roersma
(74) *Attorney, Agent, or Firm* — Chun-Ming Shih; HDLS IPR Services

(57) ABSTRACT

A drawing structure for use in a storage device of server is disclosed, which is combined with at least a storage device and includes: a housing, a carrier, an operation unit and an elastic member. The housing is formed with a bottom plate and a stop piece, and one end of the bottom plate is formed with a positioning hole allowing the carrier served to accommodate the storage device to be disposed thereon. The operation unit is disposed on the carrier and includes a positioning rod protruded from the carrier and inserted in the positioning hole. The elastic member is disposed between the carrier and the stop piece. When the positioning rod is released from the positioning hole, the carrier is pushed by the elastic member for being moved away from the housing thereby allowing the storage device to be conveniently taken out.

8 Claims, 12 Drawing Sheets

US 9,232,679 B1

DRAWING STRUCTURE FOR USE IN STORAGE DEVICE OF SERVER

BACKGROUND OF THE INVENTION

1. Field of the Invention

The present invention relates to a drawing structure for use in a storage device, especially to a drawing structure for use in a storage device of server.

2. Description of Related Art

With the development of computer, a server rack is commonly used for storing a plurality of matrix storage devices (such hard disks) for storing backup files or multimedia files.

However, the storage device of serve is mostly fastened by utilizing at least a screw, so a hand tool is required to fasten the screw into a housing; on the other hand, when the storage device is desired to be detached, the hand tool has to be utilized for releasing the screw for allowing the storage device to be taken out. The operation of screw fastening/releasing is time consuming, and the released screw may be lost due to mishandling. In addition, the hand tool is required for detaching or assembling, so inconvenience is caused.

Accordingly, the applicant of the present invention has devoted himself for researching and inventing a novel design for improving the above-mentioned disadvantages

SUMMARY OF THE INVENTION

The present invention is to provide a drawing structure for use in a storage device of server, which has advantages of simple in structure and easy in assembly, and a hand tool is not required for allowing a storage device to be conveniently taken out.

Accordingly, the present invention provides a drawing structure for use in a storage device of server, which is used for being combined with at least a storage device and includes a housing, a carrier, an operation unit and an elastic member. The housing is formed with a bottom plate and a stop piece disposed on the bottom plate, and one end of the bottom plate is formed with a positioning hole. The carrier is served to accommodate the storage device and disposed on the bottom plate. The operation unit is disposed on the carrier and includes a positioning rod, and the positioning rod is protruded from the carrier and inserted in the positioning hole. One end of the elastic member is elastically abutted against the carrier, and the other end thereof is elastically abutted against the stop piece, wherein when the positioning rod is released from the positioning hole, the carrier is pushed by the elastic recovering force of the elastic member for being moved towards a direction away from the housing.

In comparison with related art, the present invention has advantageous features as following: in the drawing structure for use in a storage device of server provided by the present invention, the elastic member is disposed between the housing and the carrier, and the operation unit is disposed on the carrier and allowed to pass the carrier for being positioned on the housing, when the operation unit is removed from the carrier for being released from the housing, the elastic recovering force of the elastic member is enabled to outwardly push the carrier, so the storage device in the carrier is able to be disconnected with a connector (provided on the housing), thus a hand tool is not required for allowing the storage device to be taken out from the carrier, thereby saving time and labor for fastening/releasing screws and simplifying the assembling and detaching process for the carrier.

DETAILED DESCRIPTION OF THE INVENTION

Preferred embodiments of the present invention will be described with reference to the drawings.

Figure 1:
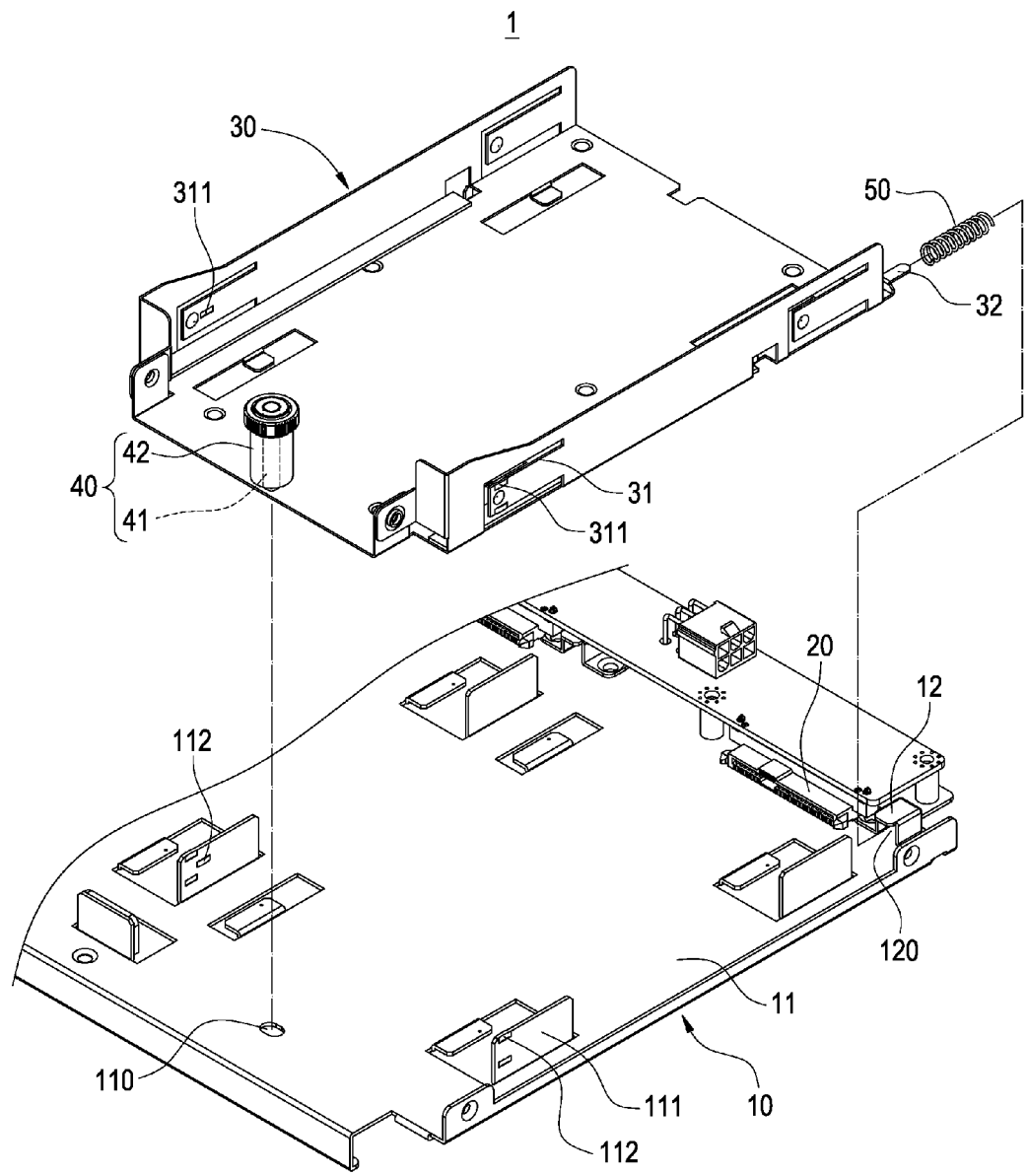
FIG. 1 a perspective view showing the drawing structure for use in a storage device of server according to a first embodiment of the present invention.
Figure 2:
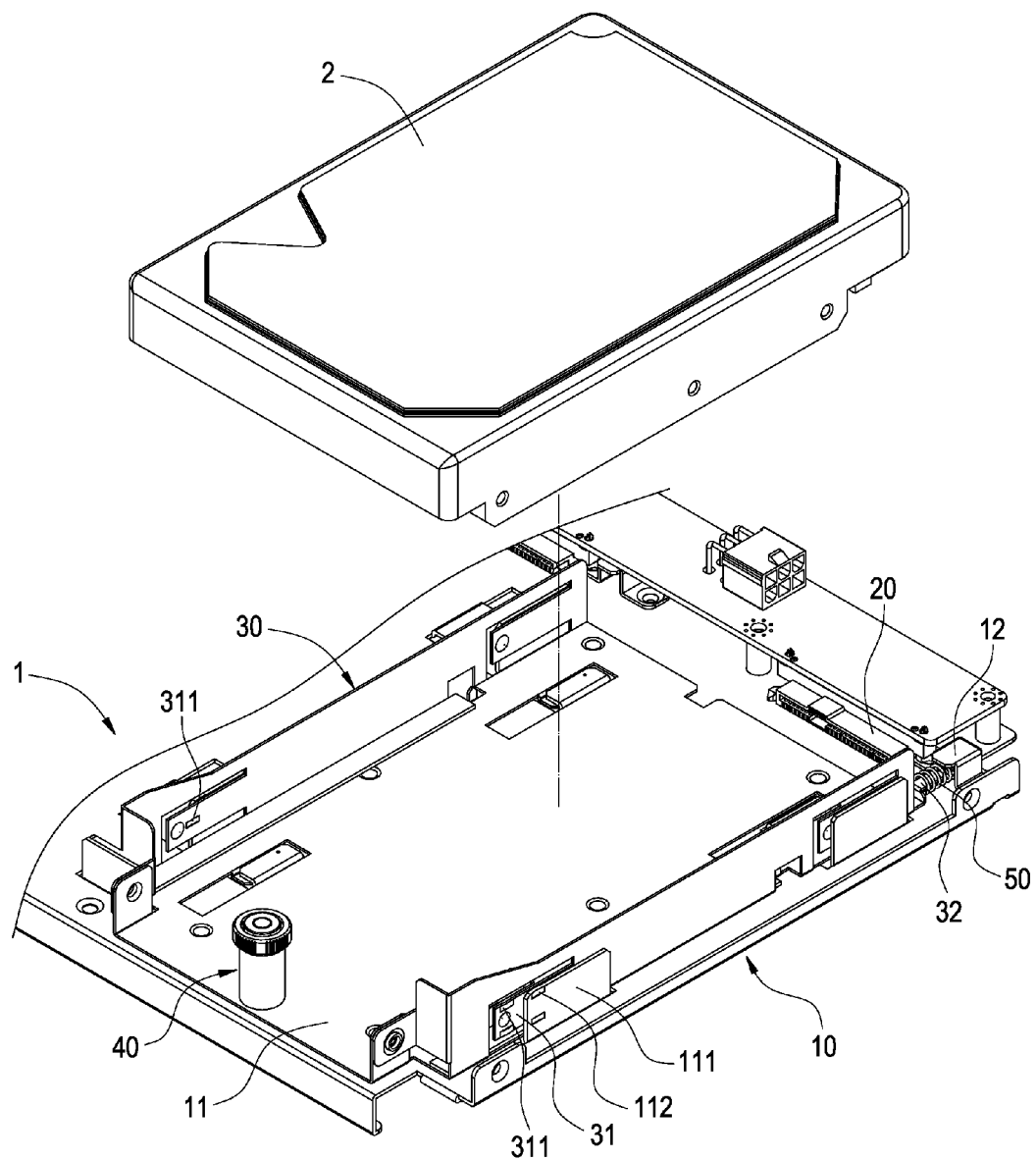
FIG. 2 is a schematic view showing the drawing structure for use in a storage device of server being disposed with a storage device according to the first embodiment of the present invention.
Figure 3:
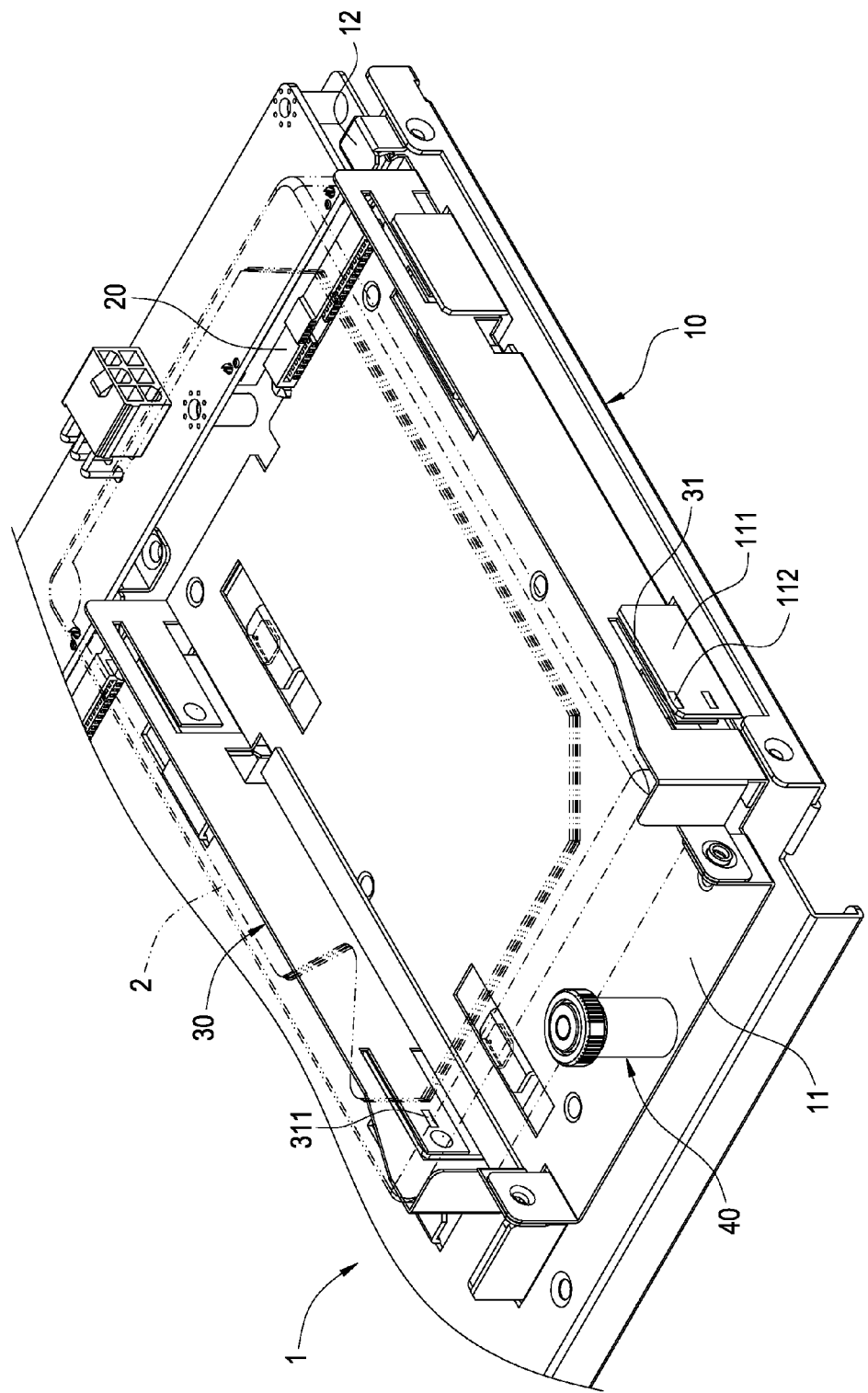
FIG. 3 is a schematic view showing the drawing structure for use in a storage device of server after the storage device being disposed according to the first embodiment of the present invention.

Please refer from FIG. 1 to FIG. 3, wherein FIG. 1 a perspective view showing the drawing structure for use in a storage device of server according to a first embodiment of the present invention; FIG. 2 is a schematic view showing the drawing structure for use in a storage device of server being disposed with a storage device according to the first embodiment of the present invention; and FIG. 3 is a schematic view showing the drawing structure for use in a storage device of server after the storage device being disposed according to the first embodiment of the present invention. The present invention provides a drawing structure 1 for use in a storage device of server, which is combined with at least a storage device 2. The drawing structure 1 includes a housing 10, a carrier 30, an operation unit 40 and an elastic member 50. According to this embodiment, the arrangement of one carrier 30 being combined on the housing 10 is only served for illustration; in actual practice, the housing 10 is able to be provided with a plurality of the carriers 30, and each of the carriers 30 can be used for accommodating a storage device 2.

The housing 10 is formed with a bottom plate 11 and a stop piece 12 disposed on the bottom plate 11, and one end of the bottom plate 11 is formed with a positioning hole 110. The installation status of the stop piece 12 is not limited to a certain status, and the stop piece 12 is used for abutting against one end of the elastic member 50. In addition, the carrier 30 is served to accommodate the storage device 2, and the carrier 30 is disposed on the bottom plate 11. Preferably, the housing 10 and the carrier 30 are made of a metal material, but what shall be addressed is that the scope of the present invention is not limited to the above-mentioned metal material. The assembly of the housing 10 and the carrier 30 will be illustrated later on.

According to this embodiment, the bottom plate 11 is formed with a plurality of block sheets 111, and each of the block sheets 111 is formed with a first positioning part 112; the carrier 30 is provided with a plurality of elastic arms 31, and each of the elastic arms 31 is formed with a second positioning part 311; when the carrier 30 is combined with the housing 10, the second positioning parts 311 of the carrier 30 are able to be mutually positioned with the first positioning parts 112 of the housing 10; accordingly, the elastic arms 31 at two sides of the carrier 30 are enabled to be positioned on the block sheets 111 of the bottom plate 11.

The operation unit 40 is disposed on the carrier 30. The operation unit 40 includes a positioning rod 41, and the positioning rod 41 is protruded from the carrier 30 and inserted in the positioning hole 110. According to this embodiment, the operation unit 40 further includes a sleeve 42 moveably combined on the carrier 30, and the positioning rod 41 is received in the sleeve 41. When the sleeve 42 is removed from the carrier 30, the positioning rod 41 is driven to be released from the positioning hole 110.

Preferably, the elastic member 50 is a compression spring. One end of the elastic member 50 is elastically abutted against the carrier 30, and the other end thereof is elastically abutted against the stop piece 12. According to one embodiment provided by the present invention, the stop piece 12 is formed as a fasten seat having an accommodation slot 120, and a part of the elastic member 50 is accommodated in the accommodation slot 120 and elastically pressed.

According to one embodiment provided by the present invention, the drawing structure 1 further includes a connector 20. The connector 20 is disposed at another end of the bottom plate 11 opposite to the positioning hole 110. The connector 20 is electrically connected to the storage device 2, and the carrier 30 is disposed at one side of the connector 20. When the storage device 2 is disposed on the carrier 30, the storage device 2 is inserted in the connector 20. According to this embodiment, one end of the carrier 30 facing the connector 20 is formed with a convex column 32, one end of the elastic member 50 is sleeved on the convex column 32, and the convex column 32 is directly formed on the housing 10, what shall be addressed is that the scope of the present invention is not limited by the arrangement of the convex column 32 being directly formed on the housing 10.

Figure 4:
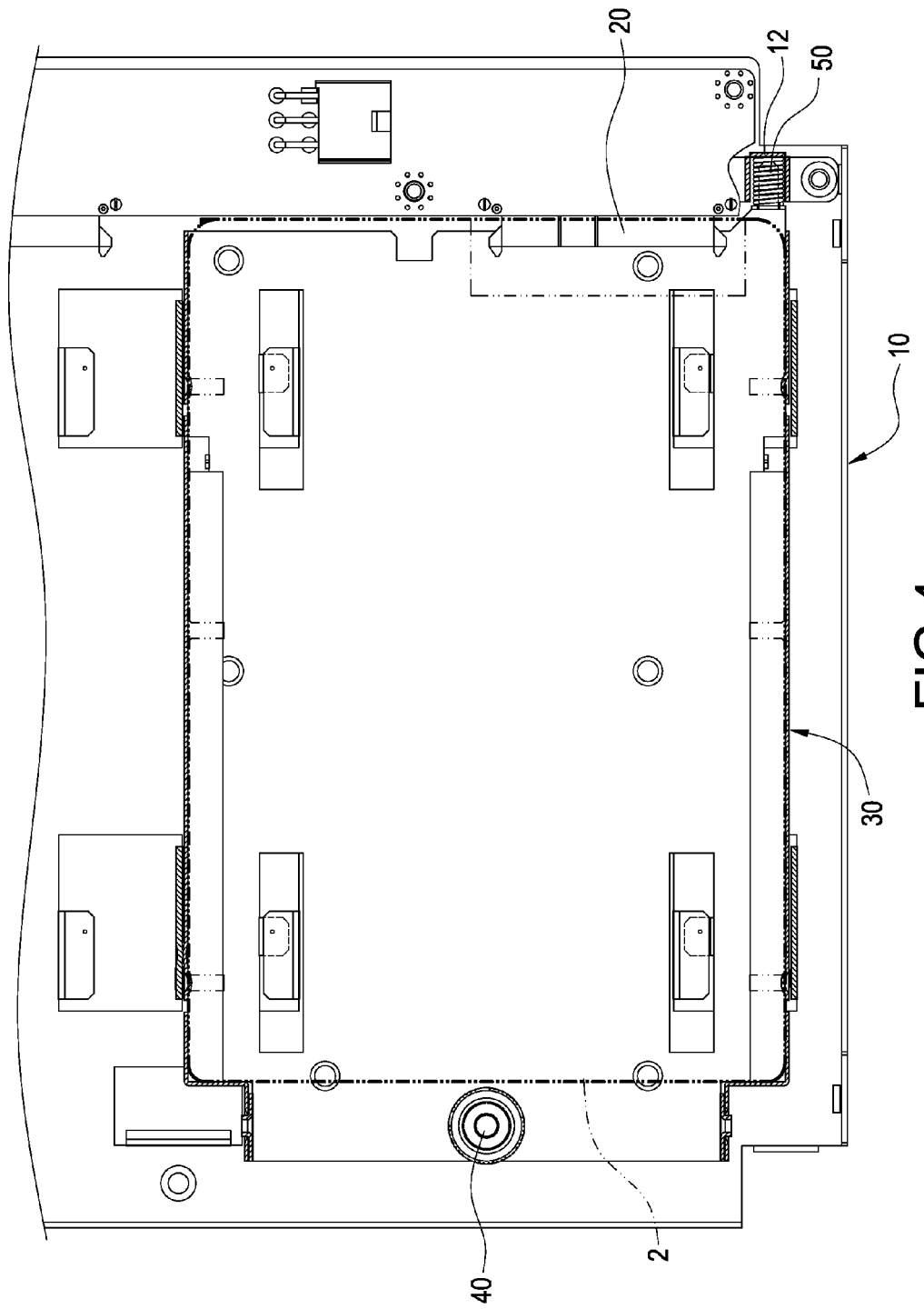
FIG. 4 is a top view showing an operating status of the drawing structure for use in a storage device of server according to the first embodiment of the present invention.
Figure 5:
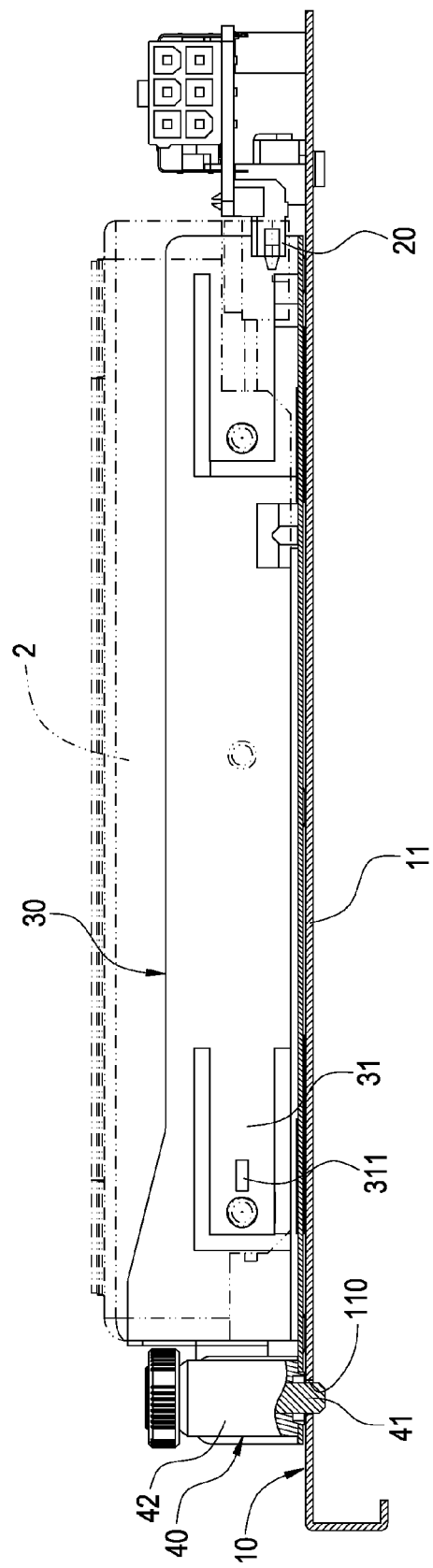
FIG. 5 is a side view showing the operating status of the drawing structure for use in a storage device of server according to the first embodiment of the present invention.

Please refer to FIG. 4 and FIG. 5, wherein FIG. 4 is a top view showing an operating status of the drawing structure for use in a storage device of server according to the first embodiment of the present invention and FIG. 5 is a side view showing the operating status of the drawing structure for use in a storage device of server according to the first embodiment of the present invention. After being assembled, through the positioning rod 41, one side of the carrier 30 is enabled to be positioned at the location where the positioning hole 110 of the housing 10 is formed, and the other end thereof is elastically abutted by the elastic member 50 so as to be moved towards a direction away from the housing 10; in addition, the storage device 2 disposed in the carrier 30 is inserted in the connector 20.

Figure 6:
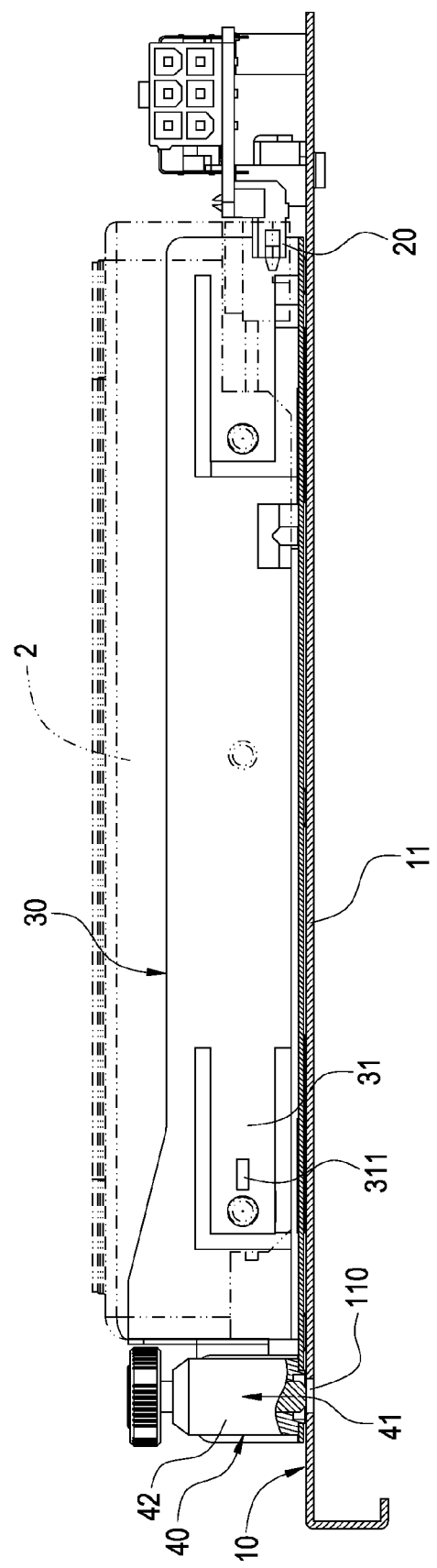
FIG. 6 is a schematic view showing an operating action of the drawing structure for use in a storage device of server according to the first embodiment of the present invention.
Figure 7:
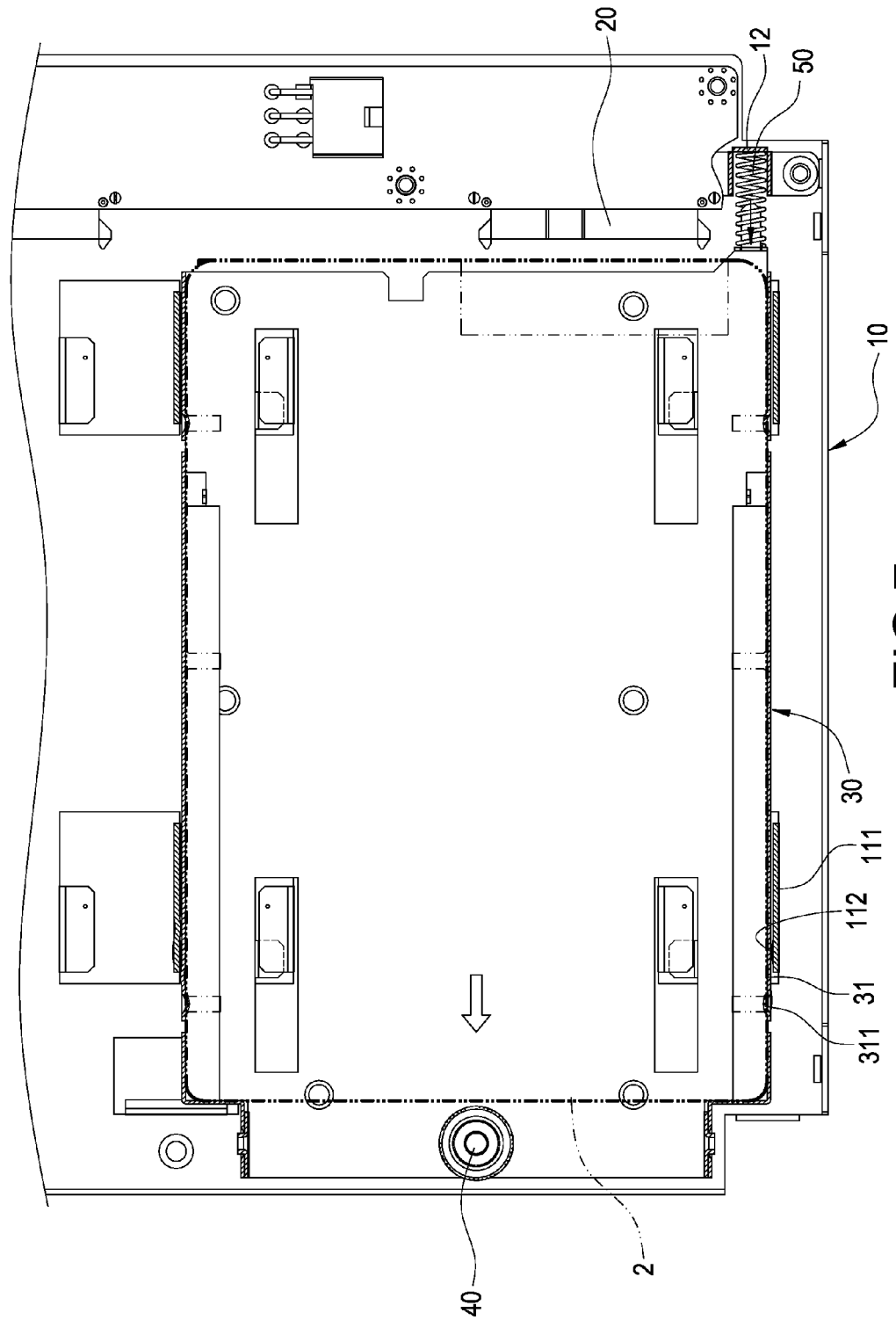
FIG. 7 is another schematic view showing the operating action of the drawing structure for use in a storage device of server according to the first embodiment of the present invention.
Figure 8:
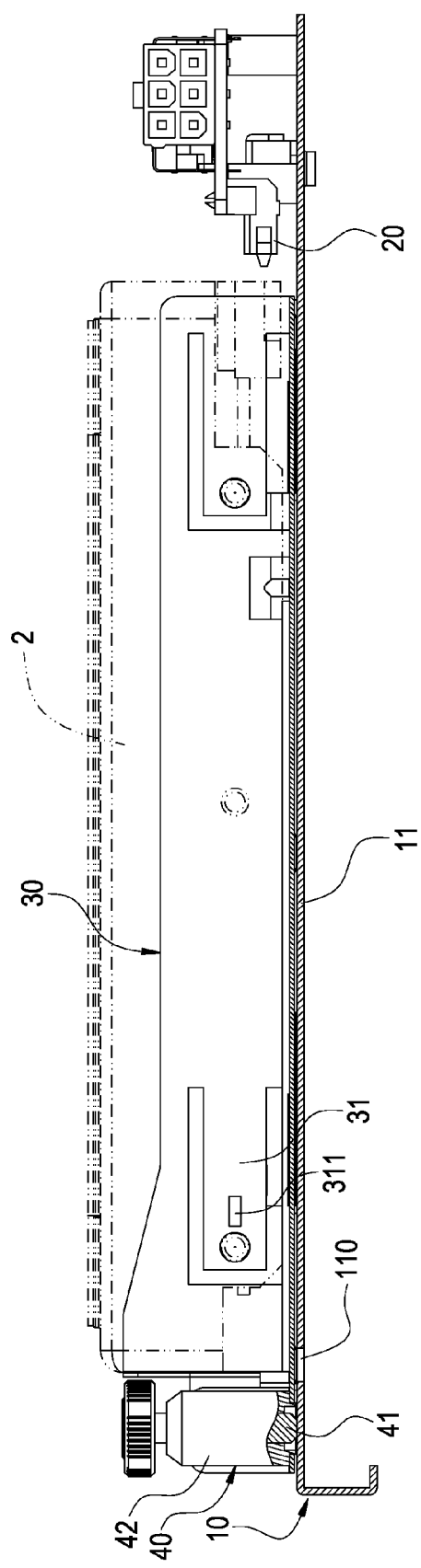
FIG. 8 is one another schematic view showing the operating action of the drawing structure for use in a storage device of server according to the first embodiment of the present invention.
Figure 9:
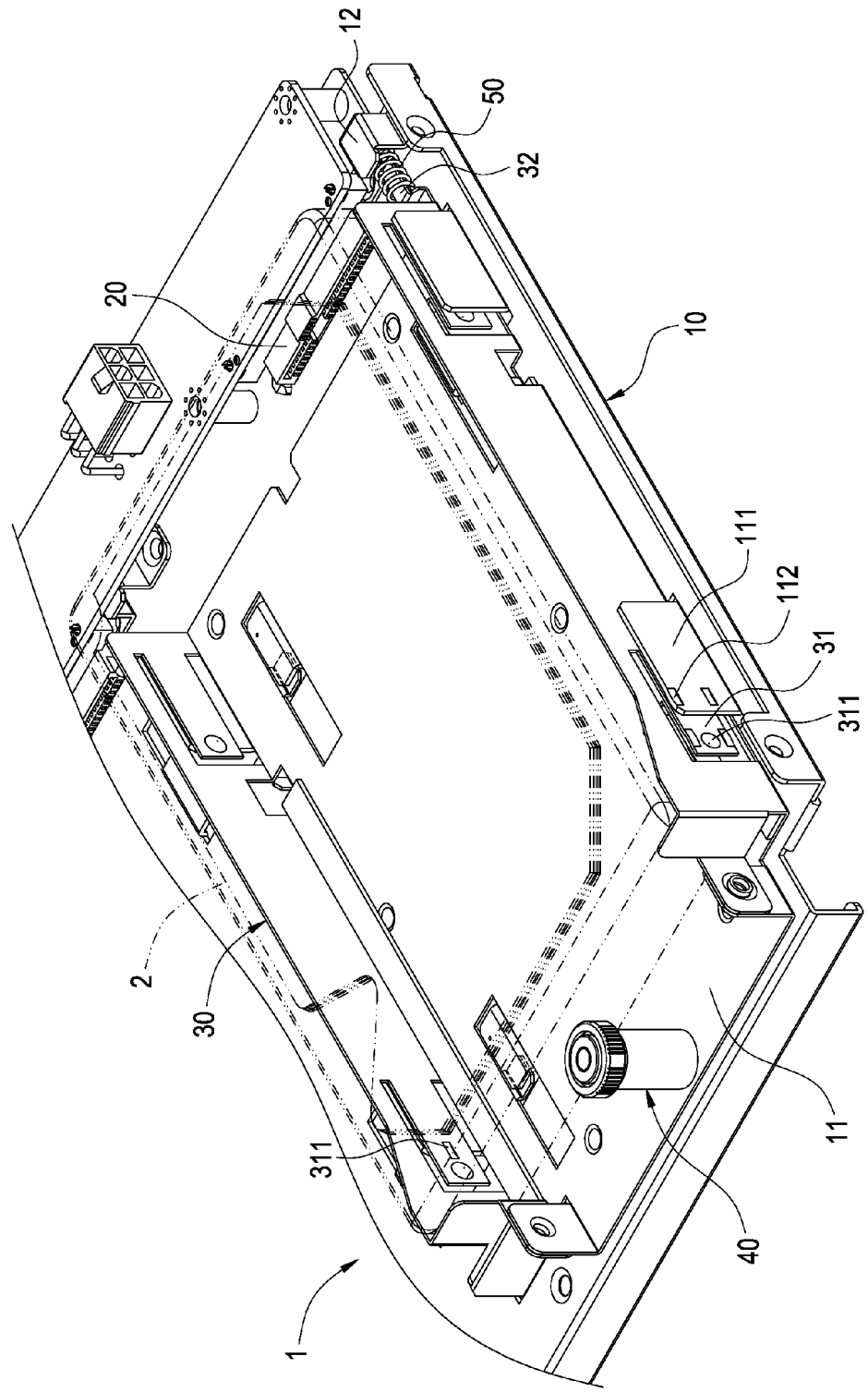
FIG. 9 is still one another schematic view showing the operating action of the drawing structure for use in a storage device of server according to the first embodiment of the present invention.

Please refer from FIG. 6 to FIG. 9, which are schematic views showing an operating action of the drawing structure for use in a storage device of server according to the first embodiment of the present invention. When the storage device 2 is desired to be taken out, the operation unit 40 is firstly pulled towards upward for allowing the positioning rod 41 to be released from the positioning hole 110 of the housing 10 (as shown in FIG. 6), at this moment the carrier 30 is elastically pushed by the elastic recovering force of the elastic member 50 for being outwardly moved (as shown in FIG. 7), and the second position part 311 of the carrier 30 is released from the first positioning part 112 of the housing 10; according to this embodiment, when the carrier 30 is moved towards the direction away from the housing 10, the storage device 2 is disconnected with the connector 20 (as shown in FIG. 8 and FIG. 9). Accordingly, the carrier 30 and the storage device 2 are enabled to be easily taken out from the housing 10.

Figure 10:
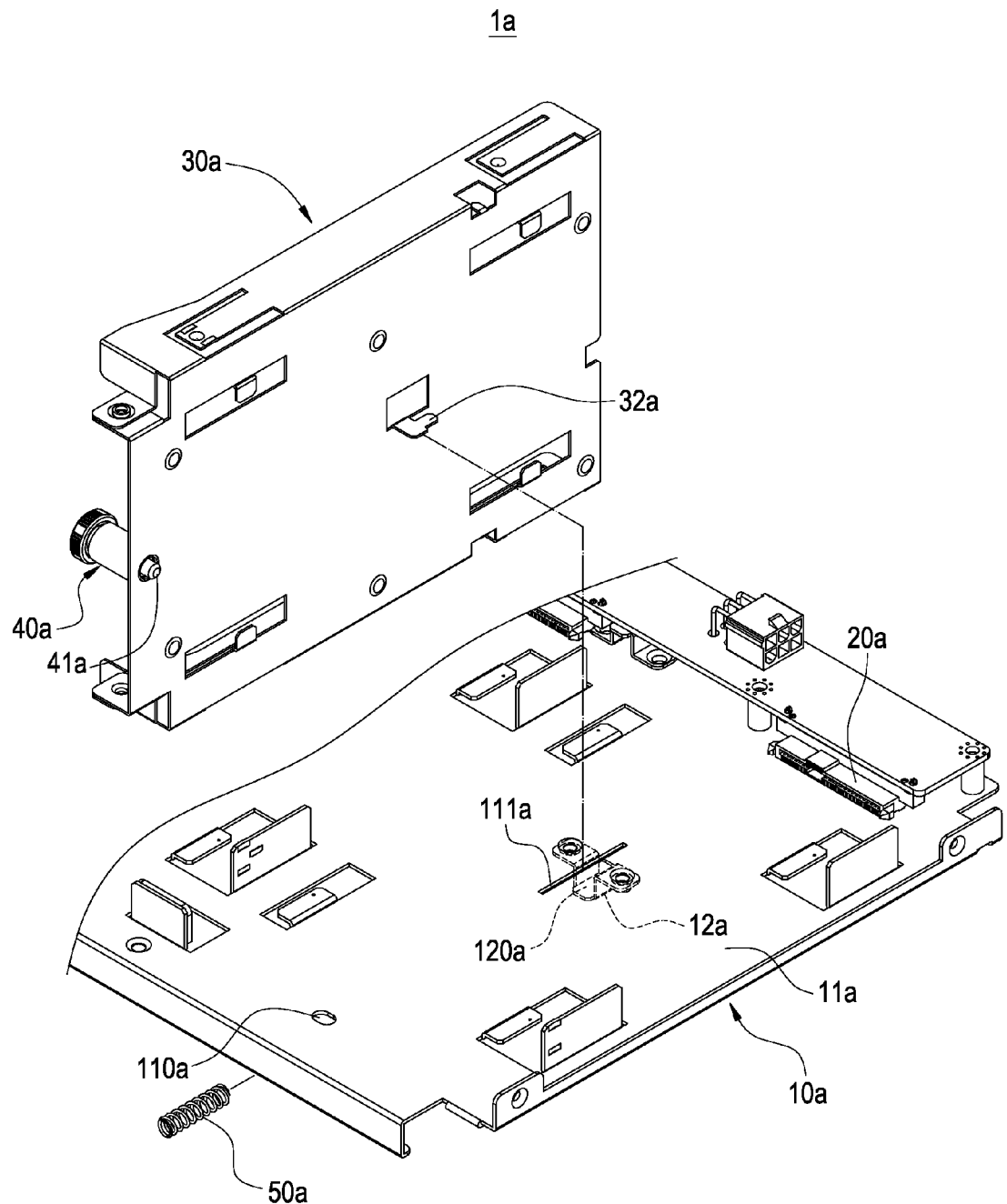
FIG. 10 a perspective view showing of the drawing structure for use in a storage device of server according to a second embodiment of the present invention.
Figure 11:
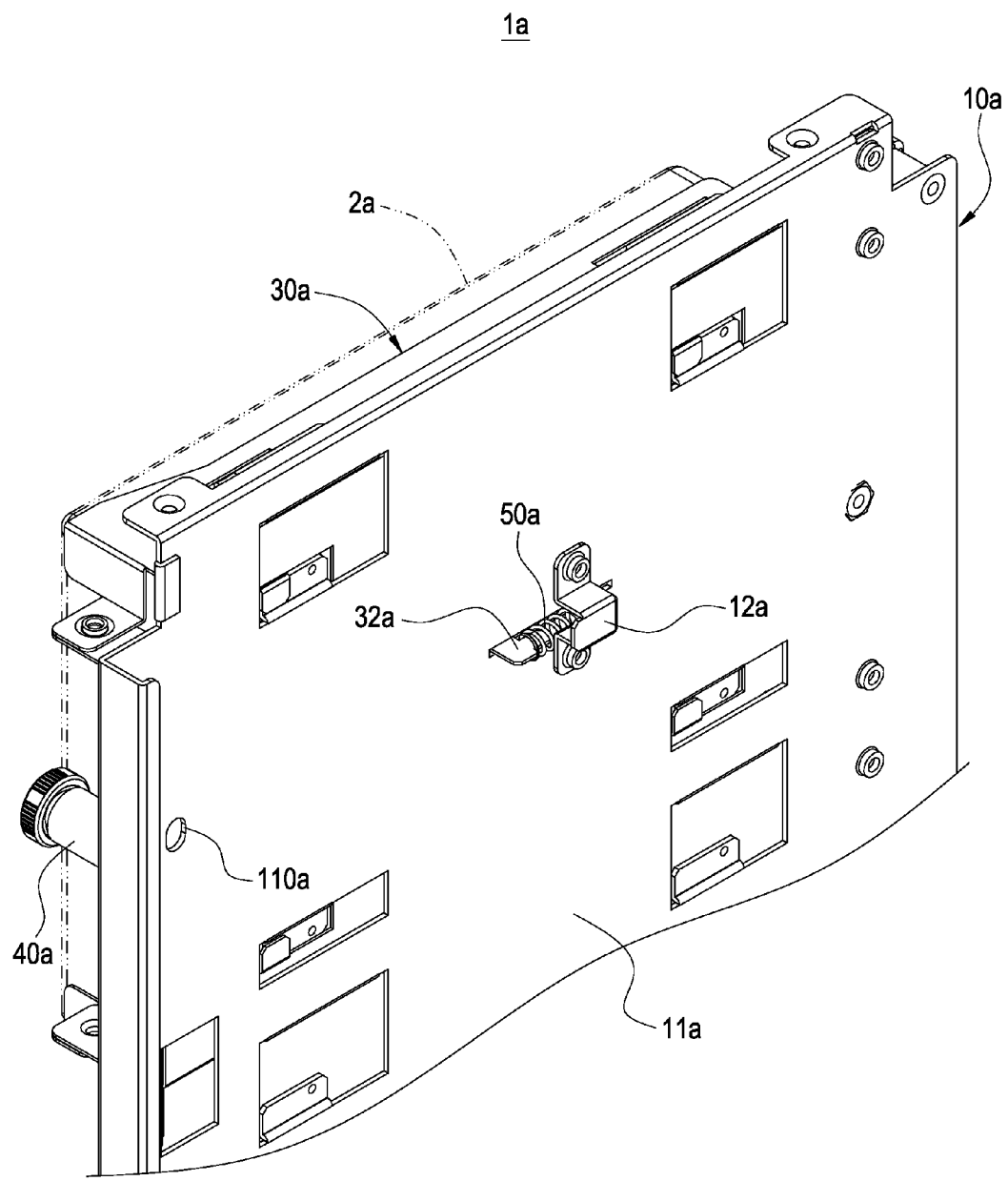
FIG. 11 a perspective view showing the assembly of the drawing structure for use in a storage device of server according to the second embodiment of the present invention.

Please refer to FIG. 10 and FIG. 11, wherein FIG. 10 a perspective view showing of the drawing structure for use in a storage device of server according to a second embodiment of the present invention and FIG. 11 a perspective view showing the assembly of the drawing structure for use in a storage device of server according to the second embodiment of the present invention. This embodiment and the first embodiment are substantially the same; the drawing structure 1a includes a housing 10a, a connector 20a, a carrier 30a, an operation unit 40a and an elastic member 50a. The housing 10a is formed with a bottom plate 11a and a stop piece 12a disposed on the bottom plate 11a, and one end of the bottom plate 11a is formed with a positioning hole 110a. The operation unit 40a is disposed on the carrier 30a and includes a positioning rod 41a, and the positioning rod 41a is protruded from the carrier 30a and inserted in the positioning hole 110a. The difference between this embodiment and the first embodiment is the combing means of the elastic member 50a.

According to this embodiment, one lateral surface of the carrier 30a facing the bottom plate 11a is formed with a hook 32a, and the hooks 32a is directly formed on the bottom plate 11a with a punching means. The bottom plate 11a is formed with a groove 111a corresponding to the hook 32a, and the hook 32a is allowed to pass the groove 111a so as to be exposed out of the bottom plate 11a. In addition, one end of the elastic member 50a is sleeved on the hook 32a. The stop piece 12a is disposed at the outer side of the bottom plate 11a corresponding to the hook 32a.

One end of the elastic member 50a (for example a compression spring) is fastened on the carrier 30a, and the other end thereof is elastically abutted against the stop piece 12a. According to this embodiment, the stop piece 12a is formed with an accommodation slot 120a, and a part of the elastic member 50a is accommodated in the accommodation slot 120a and elastically pressed.

Through the positioning rod 41a, one side of the carrier 30a is enabled to be positioned at the location wherein the positioning hole 110 of the housing 10 is formed, at this moment the carrier 30a is elastically pushed by the elastic member 50a. When being operated, the operation unit 40a is pulled towards upward for allowing the positioning rod 41a to be released from the positioning hole 110a of the housing 10a, and the carrier 30 is elastically pushed by the elastic recovering force of the elastic member 50 for being outwardly moved, so the storage device 2a is disconnected with the connector 20a thereby allowing the storage device 2a to be removed from the carrier 30a.

Figure 12:
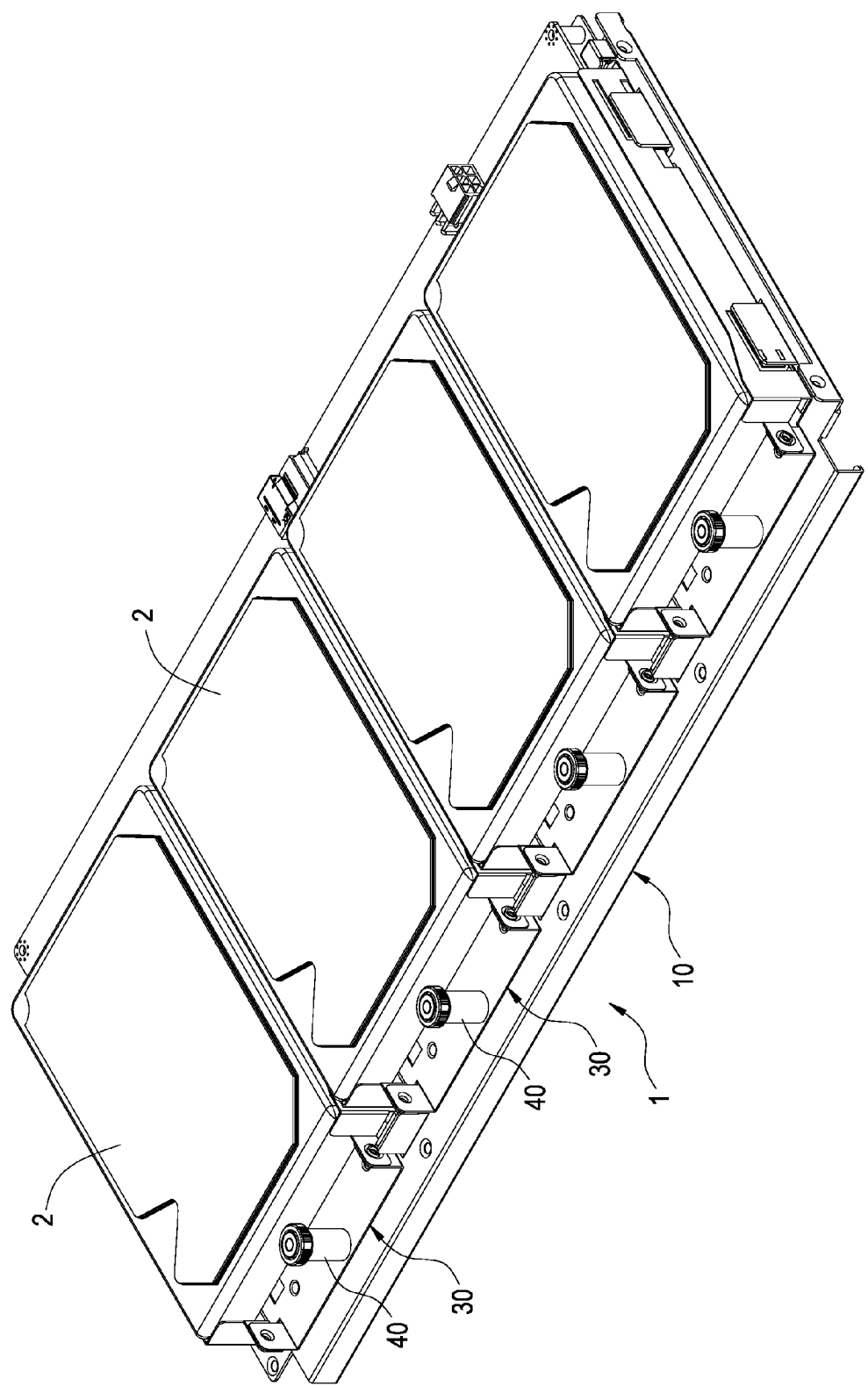
FIG. 12 a schematic view showing an application of the drawing structure for use in a storage device of server according to the second embodiment of the present invention.

Please refer to FIG. 12, which is a schematic view showing an application of the drawing structure for use in a storage device of server according to the second embodiment of the present invention. As shown in FIG. 12, the housing 10 is able to be provided with a plurality of the carriers 30, and each of the carriers 30 is served to accommodate a storage device 2. Accordingly, a plurality of the storage devices 2 are able to be stored in the housing 10, and each of the storage devices 2 is enabled to be removed from the housing 10 through upwardly pulling the operation unit 40.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A drawing structure for use in a storage device of server, combined with at least a storage device and including:
 a housing, formed with a bottom plate and a stop piece disposed on the bottom plate, and one end of the bottom plate being formed with a positioning hole;
 a carrier, served to accommodate the storage device and disposed on the bottom plate;
 an operation unit, disposed on the carrier and including a positioning rod, and the positioning rod being protruded from the carrier and slidably inserted in the positioning hole; and
 an elastic member being a compression spring, one end thereof being elastically abutted against the carrier, and the other end thereof being elastically abutted against the stop piece;
 a connector, disposed at another end of the bottom plate opposite to the positioning hole, and the storage device being inserted in the connector;
 wherein when the positioning rod is pulled upwardly to be released from the positioning hole, the carrier is pushed by an elastic recovering force of the elastic member so that the storage device is disconnected with the connector, and
 wherein at least one retaining plate is integrally protruded from the bottom plate, and at least one fixing plate corresponding to the at least one retaining plate is integrally protruded from a bottom surface of the carrier; the at least one retaining plate and the at least one fixing plate are against each other when the carrier is disposed on the bottom plate, so as to keep the carrier in close contact with the bottom plate;
 wherein the bottom surface of the carrier facing the bottom plate is formed with a hook, the hook has an extension part parallel to the bottom surface of the carrier and extends toward the connector, the bottom plate is formed with a groove corresponding to the hook, and the hook is allowed to pass the groove so as to be exposed out of the bottom plate, and one end of the elastic member is sleeved on the hook.

2. The drawing structure for use in a storage device of server according to claim 1, wherein the bottom plate is formed with a plurality of block sheets, and each of the block sheets is formed with a first positioning part; the carrier is provided with a plurality of elastic arms, and each of the elastic arms is formed with a second positioning part; the second positioning parts are able to be mutually positioned with the first positioning parts.

3. The drawing structure for use in a storage device of server according to claim 1, wherein the stop piece is formed as a fasten seat having an accommodation slot, and a part of the elastic member is accommodated in the accommodation slot and elastically pressed.

4. The drawing structure for use in a storage device of server according to claim 1, wherein one end of the carrier facing the connector is formed with a convex column, and one end of the elastic member is sleeved on the convex column.

5. The drawing structure for use in a storage device of server according to claim 4, wherein the convex column is directly formed on the carrier.

6. The drawing structure for use in a storage device of server according to claim 1, wherein the operation unit further includes a sleeve moveably combined on the carrier, and the positioning rod is received in the sleeve.

7. The drawing structure for use in a storage device of server according to claim 1, wherein the hooks is directly formed on the bottom surface of the carrier.

8. The drawing structure for use in a storage device of server according to claim 1, wherein the stop piece is disposed at an outer side of the bottom plate corresponding to the hook.

* * * * *